(12) United States Patent
Dao

(10) Patent No.: US 7,491,594 B2
(45) Date of Patent: Feb. 17, 2009

(54) METHODS OF GENERATING PLANAR DOUBLE GATE TRANSISTOR SHAPES

(75) Inventor: Thuy B. Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 342 days.

(21) Appl. No.: 11/258,987

(22) Filed: Oct. 26, 2005

(65) Prior Publication Data

US 2007/0094628 A1    Apr. 26, 2007

(51) Int. Cl.
*H01L 21/336* (2006.01)
*H01L 21/8234* (2006.01)

(52) U.S. Cl. .................. 438/197; 438/151; 438/585; 257/288; 257/347

(58) Field of Classification Search .......... 438/151, 438/197, 585; 257/288, 347
See application file for complete search history.

(56) References Cited

U.S. PATENT DOCUMENTS

| 5,097,422 | A | 3/1992 | Corbin, II et al. |
| 6,099,582 | A | 8/2000 | Haruki |
| 6,339,002 | B1 | 1/2002 | Chan et al. |
| 6,662,350 | B2 | 12/2003 | Fried et al. |
| 6,940,096 | B2 | 9/2005 | Ravi |
| 7,013,447 | B2 * | 3/2006 | Mathew et al. .......... 716/11 |
| 7,074,656 | B2 * | 7/2006 | Yeo et al. .................. 438/157 |
| 7,315,994 | B2 | 1/2008 | Aller et al. |
| 2003/0145299 | A1 | 7/2003 | Fried et al. |
| 2004/0161898 | A1 | 8/2004 | Fried et al. |
| 2005/0285161 | A1 | 12/2005 | Kang et al. |
| 2006/0017119 | A1 | 1/2006 | Jin et al. |
| 2006/0064191 | A1 * | 3/2006 | Naya et al. ............... 700/116 |
| 2007/0083847 | A1 * | 4/2007 | Mansfield et al. ........... 716/21 |

OTHER PUBLICATIONS

Nowak, Edward, et al., "Turning Silicon on its Edge: Overcoming Silicon Scaling Barriers with Double-Gate and FinFET Technology," IEEE Circuits & Devices Magazine, Jan./Feb. 2004, pp. 20-31.
Soloman, P.M., et al., "Two Gates are Better than One: A Planar Self-Aligned Double-Gate MOSFET Technology to Achieve the Best On/Off Switching Ratios as Gate Lengths Shrink," IEEE Circuits & Devices Magazine, Jan. 2003, pp. 48-62.
U.S. Appl. No. 11/098,874, filed Apr. 5, 2005.
U.S. Appl. No. 10/971,657, filed Oct. 22, 2004.
U.S. Appl. No. 11/258,777, Office Action mailed Sep. 24, 2008.

* cited by examiner

*Primary Examiner*—Phuc T Dang

(57) ABSTRACT

A method of automatically generating planar double gate transistor shapes can include taking an integrated circuit layout design that includes single gate transistors, locating the gate shapes and active shapes for the transistors, generating top gate shapes, planar double gate active shapes, bottom gate shapes, active cavity shapes, source/drain cavity shapes, and top gate contact shapes, bottom gate contact shapes, thru-gate contact shapes, and source/drain contact shapes for the planar double gate transistors. The method can generate gate contact shapes that have top and bottom gates to be electrically connected within the same planar double gate transistor or separate gate contact shapes where the top and bottom gates are not electrically connected to each other. In one embodiment, a data processing system can include a program that has code in the form of instructions to carry out the method.

21 Claims, 10 Drawing Sheets

METHODS OF GENERATING PLANAR DOUBLE GATE TRANSISTOR SHAPES

RELATED APPLICATION

The present disclosure is related to U.S. patent application Ser. No. 11/258,777 entitled "Methods of Generating Planar Double Gate Transistor Shapes and Data Processing System Readable Media to Perform the Methods" by Dao, filed concurrently herewith, assigned to the current assignee hereof, and is incorporated herein by reference in its entirety.

BACKGROUND

1. Field of the Disclosure

The present disclosure relates to methods of generating transistor shapes and data processing system readable media to perform the methods, and more particularly to methods of generating planar double gate transistor shapes and data processing system readable media to perform the methods.

2. Description of the Related Art

Conventional integrated circuits ("ICs") can include single gate transistors, wherein active regions of those single gate transistors lie within a substantially monocrystalline silicon substrate and have a gate dielectric layer and a gate electrode overlying the active regions. Single gate transistors may have higher leakage current compared to planar double gate transistors.

Planar double gate transistors allow for better control of transistors. Converting a single gate transistor shape to a planar double gate transistor shape can be done manually during IC design. However, many integrated circuits include a million, a billion or more transistors within a single integrated circuit. The process of manually converting each of these transistor shapes requires an extraordinarily large number of man-hours.

BRIEF DESCRIPTION OF THE DRAWINGS

Embodiments are illustrated by way of example and not limitation in the accompanying figures.

Figure 1:
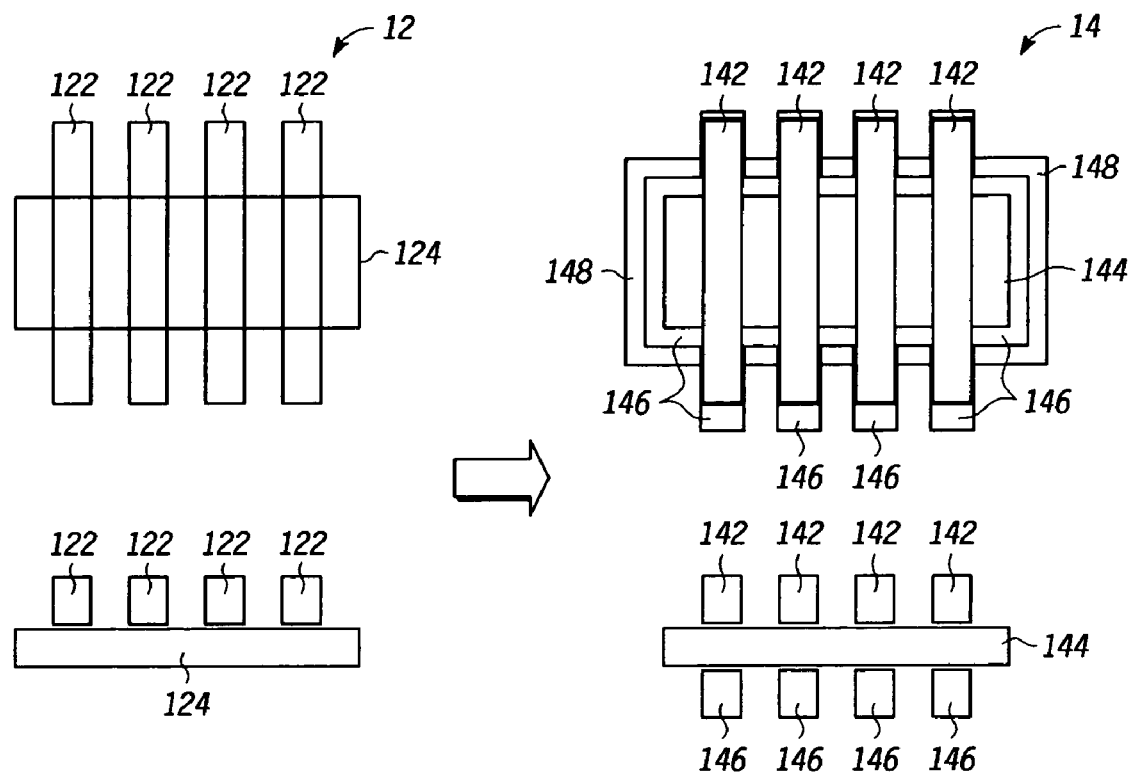
FIG. 1 includes an illustration that depicts generating a planar double gate transistor shape from a convention single gate transistor shape.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments.

DETAILED DESCRIPTION

A method of automatically generating planar double gate transistor shapes using a data processing system can include taking an integrated circuit layout design that includes single gate transistors, locating the gate shapes and active shapes for the transistors, generating top gate shapes, planar double gate active shapes, bottom gate active shapes, source/drain cavity shapes, and active cavity shapes for the planar double gate transistors. The method is well suited for, but not limited, to converting planar single gate transistor shapes that are designed to have channel regions within a substantially monocrystalline semiconductor substrate or a well region within that substrate to planar double gate transistor shapes designed for semiconductor-on insulator substrates. The method can generate thru-gate contact shape that have top and bottom gates to be electrically connected to the same interconnection conductor line or separate gate contact shapes where the top and bottom gates are electrically connected to separate interconnection conductor lines. The method can also potentially reduce the number of fabrication steps. In one embodiment, a data processing system can include a program that has code in the form of instructions to carry out the method. As used herein, "shape" refers to information regarding a subsequently formed physical feature within an electronic device that substantially corresponds to a designed feature within a layout.

The term "double gate transistor" is intended to mean a transistor that includes at least two different gate electrodes. In one embodiment, a double gate transistor has only two gate electrodes. In another embodiment, a double gate transistor has more than two gate electrodes.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Unless stated otherwise, components may be bi-directionally or uni-directionally coupled to each other. Coupling should be construed to include direct electrical connections and any one or more of intervening switches, resistors, capacitors, inductors, and the like between any two or more components.

Other features and advantages of the invention will be apparent from the following detailed description, and from the claims.

To the extent not described herein, many details regarding specific materials, processing acts, design, layout, and circuits are conventional and may be found in textbooks and other sources within the semiconductor, design, layout, circuits, and microelectronic arts.

A method can be used to automatically generate planar double gate transistor shapes from single gate transistor shapes and are described in more detail below. FIG. 1 illustrates a general principle for performing the method as described herein. An integrated circuit 12 can include single gate transistors that include gate shapes 122 and an active shape 124. The integrated circuit 12 can include more or fewer single gate transistors, and such single gate transistors may include different shapes for their gate electrodes, their active regions, or any combination thereof. Using an automated method as described herein, the integrated circuit 12 can be transformed into an integrated circuit 14. The integrated circuit 14 includes planar double gate transistors that generally correspond to the single gate transistors in integrated circuit 12. The integrated circuit 14 can be formed using top gate electrode shapes 142, a planar double gate active region shape 144, a bottom gate electrode shape 146, and an active cavity shape 148. Other shapes can be formed and may include gate contact shapes, source/drain ("S/D") cavity and contact shapes, and other shapes and other levels used to interconnect electronic components to one another.

The illustration near the bottom right hand corner of FIG. 1 shows a conceptual cross-sectional view of the transistor structure for some of the layout layers of the planar double gate transistors illustrated near the top right and corner of FIG. 1. The actual planar double gate transistors formed may or may not correspond to the shapes shown near the bottom right hand corner of FIG. 1. After reading this specification, skilled artisans will appreciate that many different layouts and configurations can be possible while using the concepts as described herein.

Figure 2:
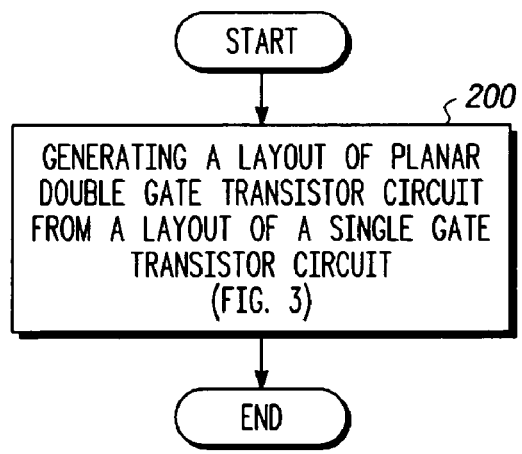
FIG. 2 includes a high-level flow diagram for a method of generating planar double gate transistor shapes from single gate transistor shapes.

FIG. 2 includes a high-level flow diagram in accordance with an embodiment. The method can include generating a layout of a planar double-gate transistor circuit from a layout of a single gate transistor circuit (block 200). A more detailed flow diagram is described with respect to FIG. 3. In another embodiment, a layout of planar double-gate circuits can be generated from another circuit layout, such as a semiconductor-on insulator ("SOI") transistor layout.

Figure 3:
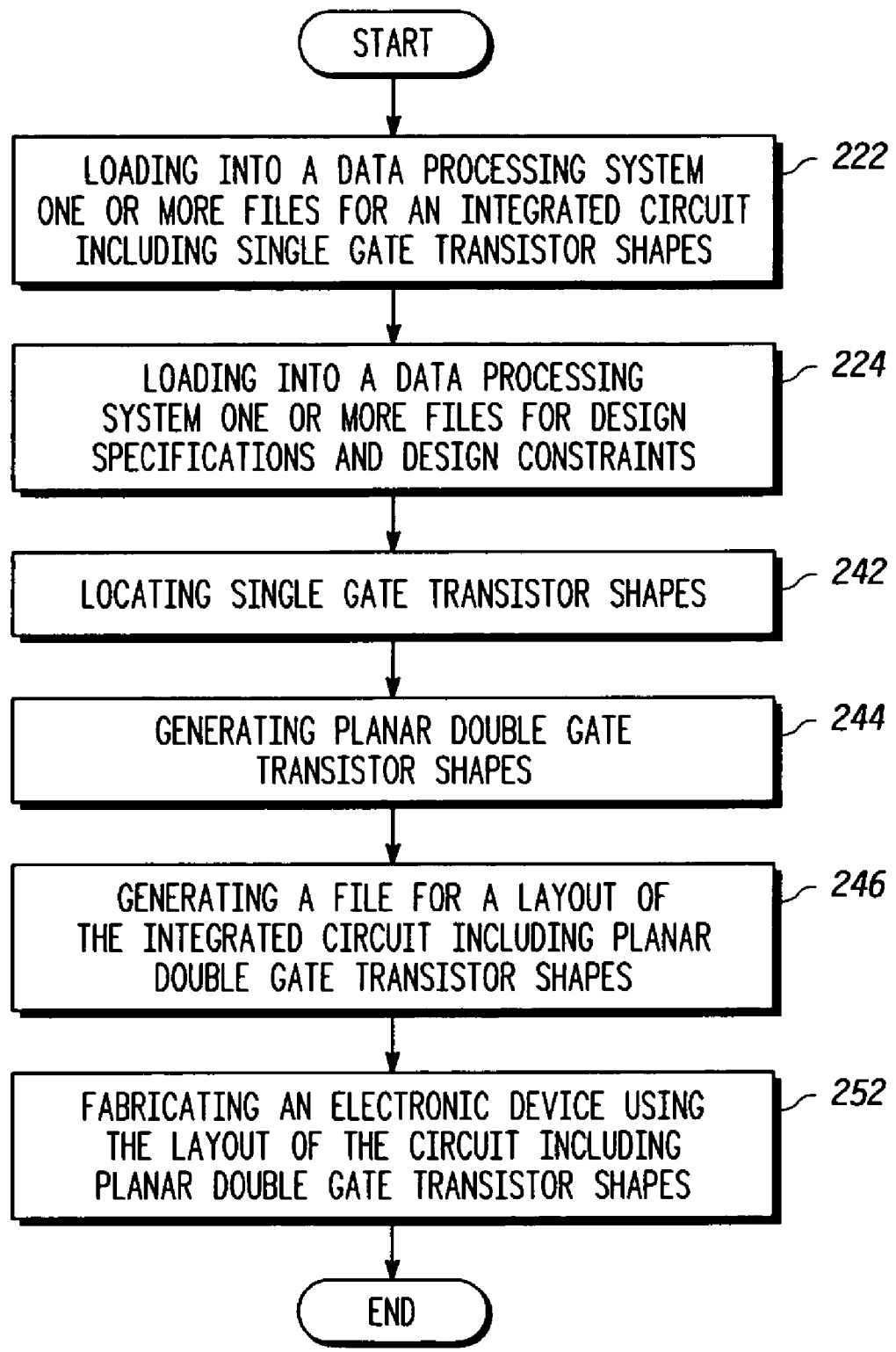
FIG. 3 includes a more detailed flow diagram for a method of generating planar double gate transistor shapes from single gate transistors shapes.

FIG. 3 includes a process flow diagram for converting a layout of single gate transistors to a layout of planar double gate transistors. The method can include loading into a data processing system one or more files for an integrated circuit including single gate transistor shapes (block 222). In one embodiment, the single gate transistor and its corresponding data may be found in any one or more of the layers used in forming the single gate transistor. Such layers can include a gate layout layer, and active layout layer, an implantation layout layer, a contact layout layer, a via layer layout, an interconnect layer layout, a well layer layout, a passivation layer layout, one or more other layout layers, or any combination thereof. The method can also include loading into the data processing system one or more files for design specifications and design constraints (block 224). Such design specifications can include transistor channel length, transistor channel width, well ties, resistor values, capacitor values, one or more other physical or electrical specifications, or any combination thereof. The design constraints can include design rules or other limitations for the integrated circuit. For example, a design rule can include a minimum feature size, a minimum space between features, or other similar limitation. The method can further include locating single gate transistor shapes (block 242), as described with respect to FIGS. 4 and 5, and generating planar double gate transistor shapes (block 244), as described with respect to FIGS. 6 through 16. The method can also include generating a data processing file, which can be used within a data processing system, for a layout of the integrated circuit including planar double gate transistor shapes (block 246). The method can further include fabricating an electronic device using the layout of the integrated circuit including planar double gate transistor shapes (block 252). For example, a set of lithographic masks can be generated using the layout information, and the set of lithographic masks can be used at different levels to define planar double active regions, top gate electrodes, bottom gate electrodes, define contact openings, etc.

Figure 4:
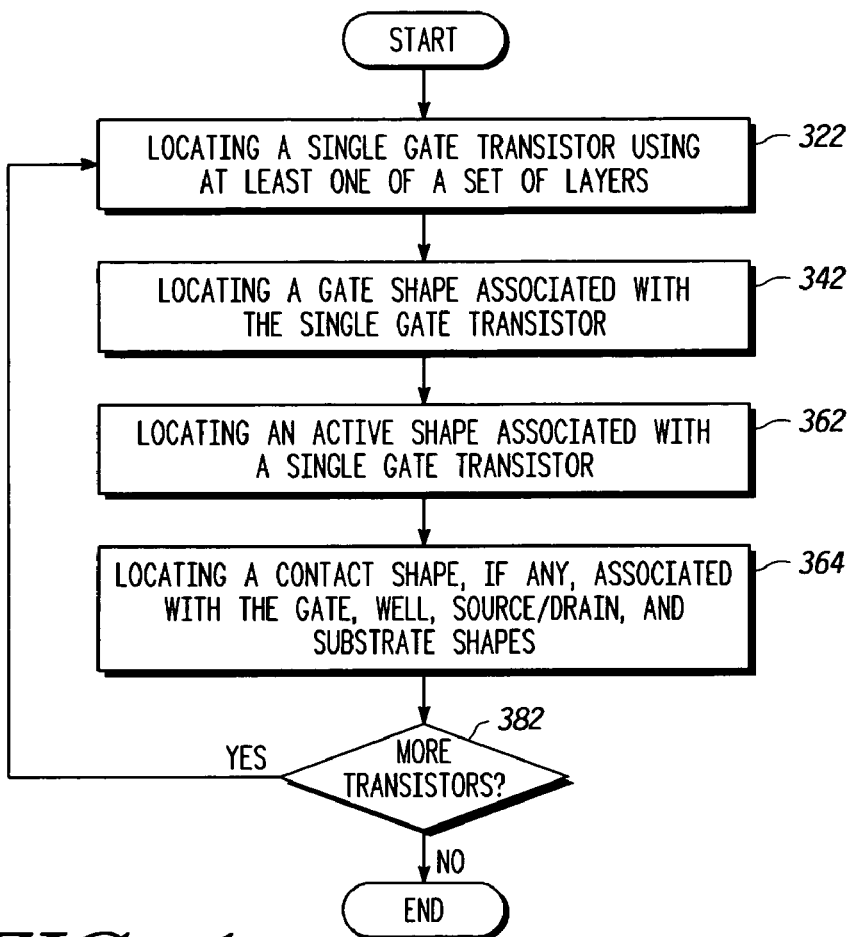
FIG. 4 includes a flow diagram for locating single gate transistor shapes.
Figure 5:
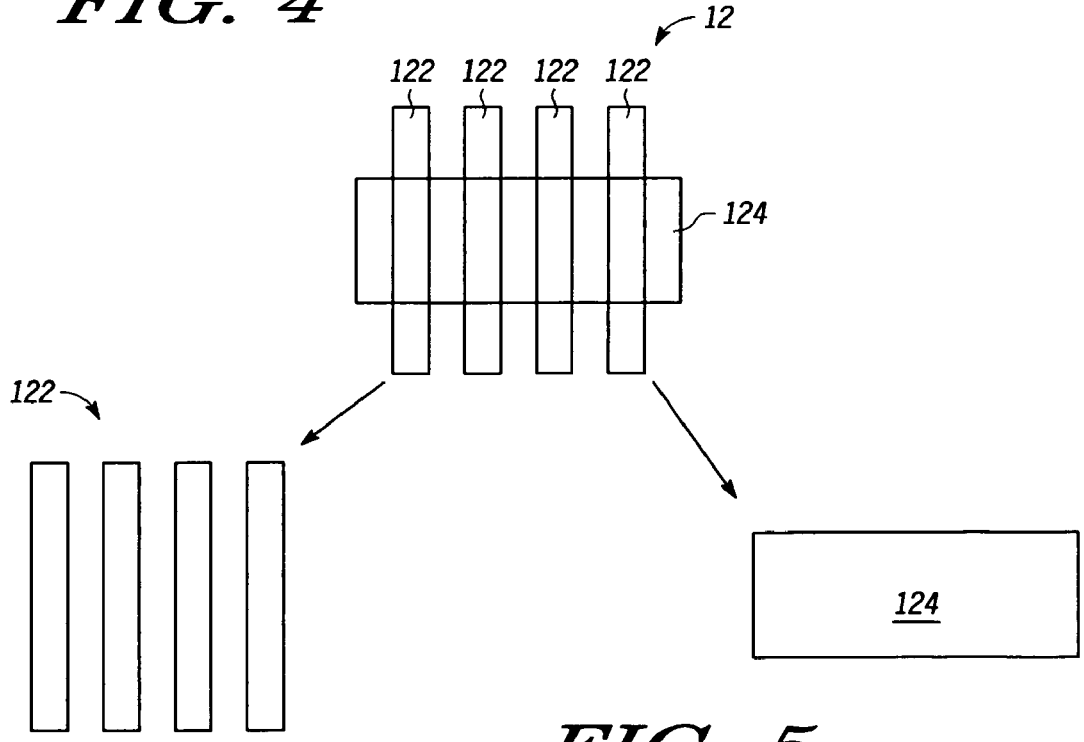
FIG. 5 includes an illustration of gate shapes and an active shape that can be located from a single gate transistor shape.

A portion of the method related to locating single gate transistor shapes is described more specifically with respect to FIGS. 4 and 5. The method can include locating a single gate transistor using at least one of a set of layers (block 322 in FIG. 4). Such layers have been previously described. A gate layout layer, by itself, may not be enough to locate single gate transistors. For example, a shape within the gate layout layer may correspond to a resistor or a capacitor electrode. The manner for locating the single gate transistor can be highly variable depending on the specific methodology chosen. For example, transistors may be located by tracing a signal from a bond pad corresponding to the passivation layout layer, through one or more interconnect layout layers, one or more via layout layers, one or more contact layout layers, an active layout layer, or any combination thereof. In one embodiment, the single gate transistors may be located by searching for any shape within the gate layout layer that extends completely across a dimension of the active layout layer.

After a single gate transistor has been located, the method can include locating a gate shape associated with the single gate transistor (block 342). As the gate shape is found, it can be stored in memory. The method can also include locating an active shape associated with the single gate transistor (block 362). As the active shape is located, it can be stored in memory, too. The method can further include locating a contact shape, if any, associated with any one or more of the gate, well, S/D, and substrate shapes (block 364). The contact shape may be relevant in determining whether the single gate transistor lies within a well region that is biased at a potential other than the substrate or other portion of the integrated circuit. The significant of such contact shape will be described later with respect to contact shapes associated with gate shapes for the planar double gate transistors. A determination can be made whether there is another single gate transistor (diamond 382) in the layout of the integrated circuit. If "yes," the method is iterated until all single gate transistors have been located in the layout of the integrated circuit. If there are no more single gate transistors, the method for locating single gate transistor shapes is complete.

FIG. 5 includes an illustration of some single gate transistor shapes within the integrated circuit 12. From the information obtained, gate shapes 122 and an active shape 124 have been found. Other gate shapes and other active shapes are also found using the same method. The illustration in FIG. 5 is a non-limiting exemplary embodiment.

Figure 6:
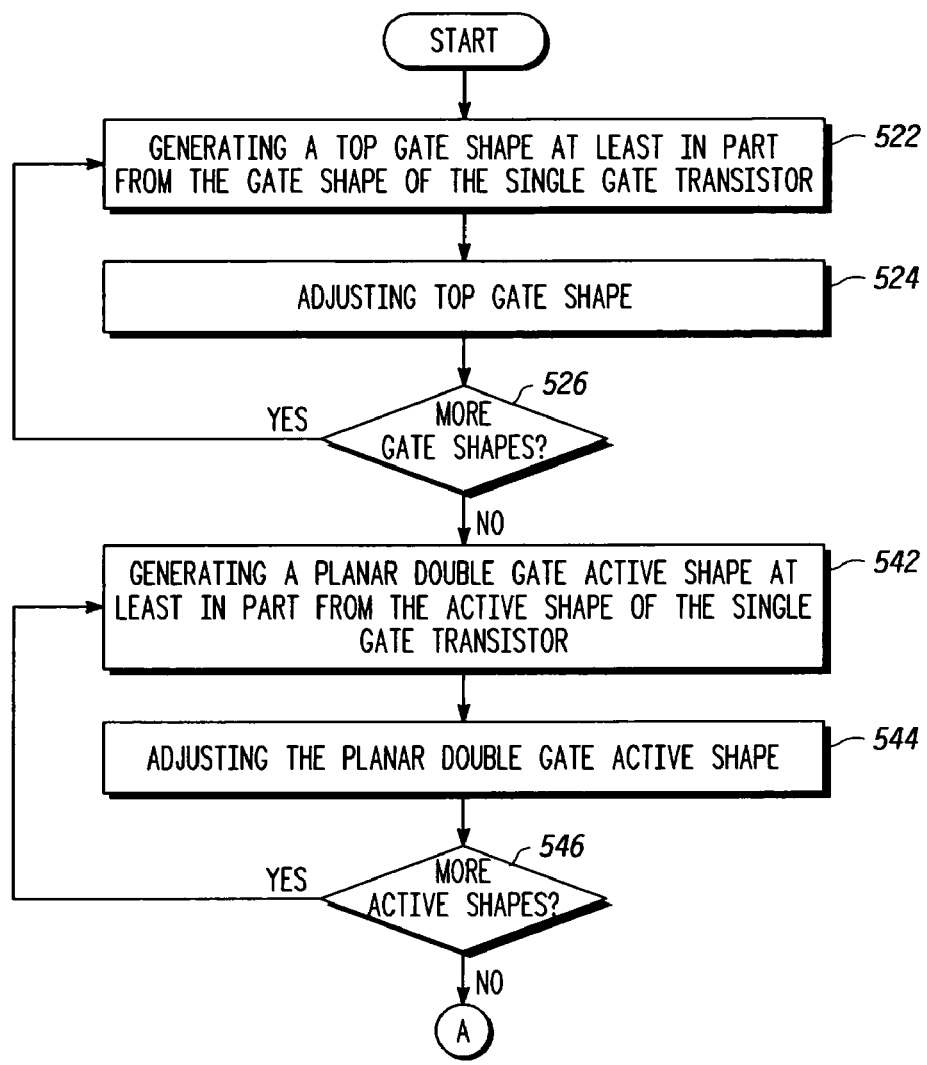
FIG. 6 includes a flow diagram for generating top gate shapes and planar double gate active shapes for the planar double gate transistor shapes.

The planar double gate transistor shapes can now be generated as described herein. Referring to FIG. 6, the method can include generating a top gate shape at least in part from the gate shape of the single gate transistor (block 522) and adjusting the top gate shape (block 524).

Adjusting, when referring to this figure and other subsequent figures, can include re-sizing, shifting, re-locating, moving, copying, rotating, flipping, duplicating, biasing (e.g., sizing differentials), combining, shrinking, subtracting, adding, overlapping, under-lapping, overlaying, performing an inclusive-OR operation, performing an AND operation, performing an exclusive-OR operation, performing a NOT operation, performing Boolean algebraic operation, performing an exclusion operation, cutting, pasting, grouping, un-grouping, performing one or more operations from a script or other programming, performing a computer-aided design ("CAD") operation, or any combination thereof. The adjustments may be performed in order to better meet one or more of the design specifications, one or more of the design constraints, or any combination thereof.

In another embodiment, information related to well ties or other device information (e.g., whether the transistor is an n-channel, a p-channel, an enhancement mode, a depletion mode, or other similar information) may be used in adjusting the top gate shape. Such information may be relevant in later determining whether gate contacts will be made separately to the top and bottom gates for a transistor or if such top and bottom gates of a planar double gate transistor are to be electrically connected to each other. Such adjustments for gate contacts can be performed later in the method if desired. In another embodiment, another adjustment for the top gate shape may include adding a resistor portion, a capacitor electrode portion, or other electronic component portion.

Figure 7:
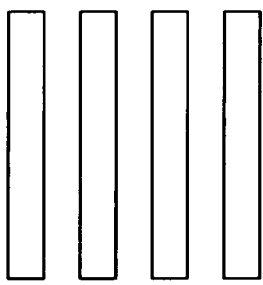
FIG. 7 includes an illustration of top gate shapes of planar double gate transistors generated at least in part from the gate shapes of single gate transistors.

A determination can be made whether there is another top gate shape to be generated (diamond 526). If "yes," the method is iterated until all top gate shapes have been generated. If there are no more top gate shapes, the top gate shapes can be stored in memory. FIG. 7 includes an illustration of top gate shapes 642 that are generated at least in part from the gate shapes 122.

The method can include generating a planar double gate active shape at least in part from the active shape of the single gate transistor (block 542 in FIG. 6) and adjusting the planar double gate active shape (block 544) using any one or more of the adjusting operations previously described. The adjustments may be performed in order to better meet one or more of the design specifications, one or more of the design constraints, or any combination thereof. In another embodiment, another adjustment for the double transistor active shape may include adding a resistor portion, a capacitor electrode portion, or other electronic component portion.

Figure 8:
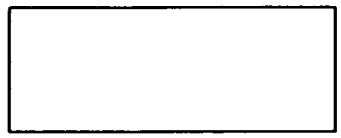
FIG. 8 includes an illustration of a planar double gate active shape generated at least in part from the active shape of single gate transistors.

A determination can be made whether there is another planar double gate active shape to be generated (diamond 546). If "yes," the method is iterated until all planar double gate active shapes have been generated. If there are no more planar double gate active shapes, the planar double gate active shapes can be stored in memory. FIG. 8 includes an illustration of a planar double gate active shape 744 that is generated at least in part from the active shape 144.

Figure 9:
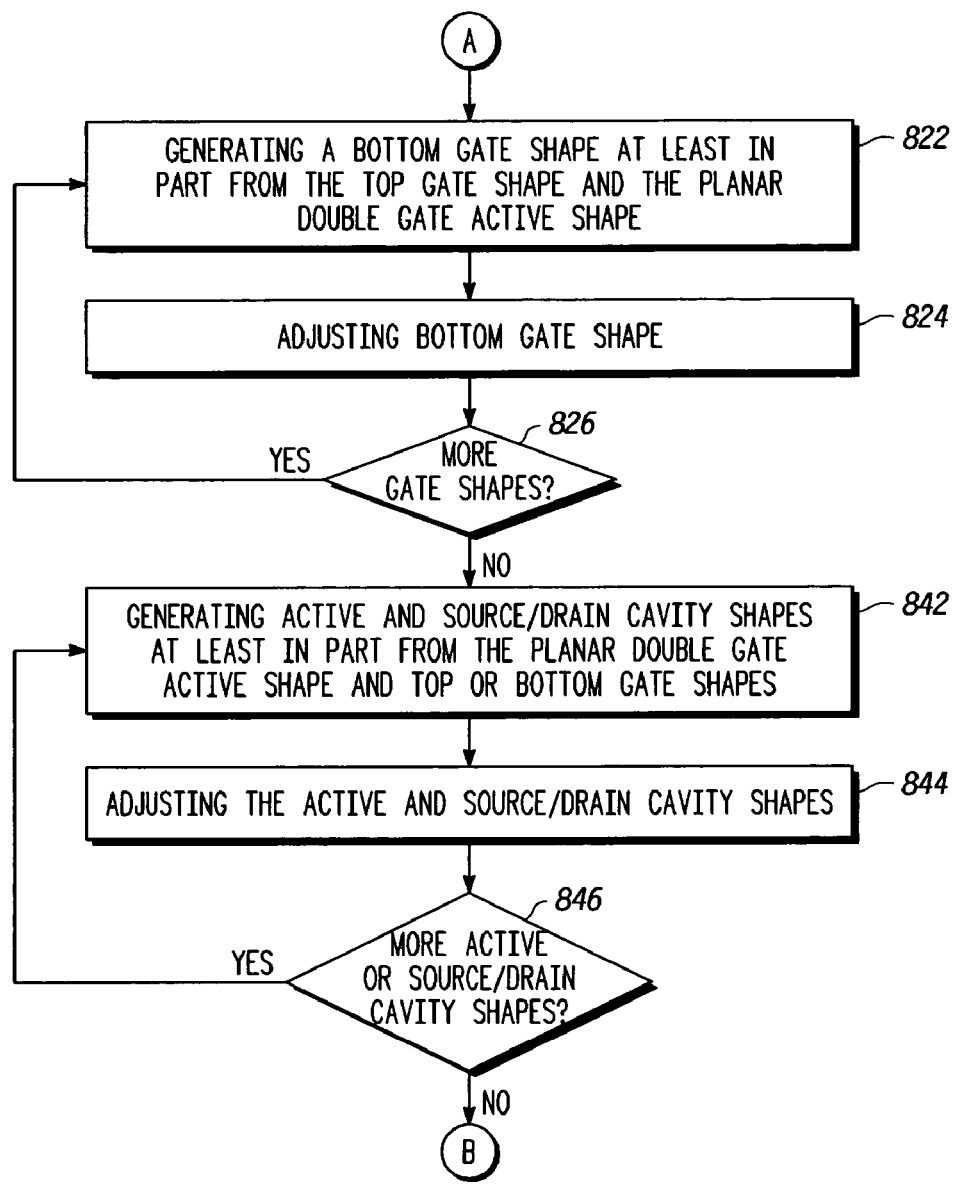
FIG. 9 includes a flow diagram for generating bottom gate shapes, active cavity shapes, and source/drain cavity shapes for the planar double gate transistor shapes.

Referring to FIG. 9, the method can include generating a bottom gate shape at least in part from the top gate shapes and the planar double gate active shape (block 822). In one particular embodiment, an inclusive-OR operation can be performed such that the initial bottom gate shape corresponds to a combination of the top gate shapes and the planar double gate active shapes. The method can also include adjusting the bottom gate shape (block 824) using any one or more of the adjusting operations previously described. The adjustments may be performed in order to better meet one or more of the design specifications, one or more of the design constraints, or any combination thereof. In a particular embodiment, the portion of the bottom gate shape that is associated with the planar double gate active shape can be increased in the length, the width, or both to allow for potential misalignment between the bottom gate layout layer and the planar double gate active layer when forming integrated circuits. In another particular embodiment, the adjustment for the planar double gate active portion of the bottom gate shape may not be performed. In another embodiment, the portion of the bottom gate shape that is associated with the planar double gate active shape can be increased in the length, the width, or both to allow for potential misalignment between the bottom gate layout layer and the planar double gate active layer when forming integrated circuits.

In another embodiment, information related to well ties or other device information (e.g., whether the transistor is an n-channel, a p-channel, an enhancement mode, a depletion mode, or other similar information) may be used in adjusting the bottom gate shape. Such information may be relevant in later determining whether gate contacts will be made separately to the top and bottom gates for a transistor or if such top and bottom gates are to be electrically connected to each other. Such adjustments for gate contacts can be performed later in the method if desired. In another embodiment, another adjustment for the bottom gate shape may include adding a resistor portion, a capacitor electrode portion, or other electronic component portion.

Figure 10:
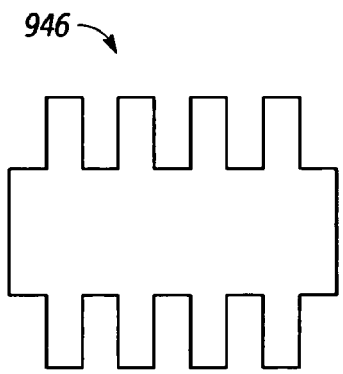
FIG. 10 includes an illustration of a bottom gate shape generated at least in part from the top gate and planar double gate active shapes.

A determination can be made whether there is another bottom gate shape to be generated (diamond 826). If "yes," the method is iterated until all bottom gate shapes have been generated. If there are no more bottom gate shapes, the bottom gate shapes can be stored in memory. FIG. 10 includes an illustration of a bottom gate shape 946 that is generated at least in part from the top gate shapes 642 (FIG. 7) and the planar double gate active shape 744.

The method can include generating active cavity and S/D cavity shapes at least in part from the planar double gate active shape and top or bottom gate shapes (block 842 in FIG. 9) and adjusting the active cavity and S/D cavity shapes (block 844) using any one or more of the adjusting operations previously described. The adjustments may be performed in order to better meet one or more of the design specifications, one or more of the design constraints, or any combination thereof. In another embodiment, the active cavity shape can be generated at least in part from the planar double gate active portion of the bottom gate shape 946 (FIG. 10) in addition to or in place of the planar double gate active shape. In one particular embodiment, the active cavity shape can be increased in the length, the width, or both, as compared to the portion of the bottom gate shape that is associated with the planar double gate active shape, to allow for potential misalignment between the active cavity layout layer and the bottom gate layout layer when forming integrated circuits. In still another particular embodiment, the portion of the bottom gate shape that is associated with the planar double gate active shape may be one minimum feature size larger than the planar double gate active shape along each side, and the active cavity shape may be one minimum feature size larger than the portion of the bottom gate shape that is associated with the planar double gate active shape. Therefore, in this particular embodiment, $$A_{dgas} = L \times W;$$

$$A_{bgdgas} = (L+2f) \times (W+2f); \text{ and}$$

$$A_{acs} = (L+4f) \times (W+4f),$$

wherein:

$A_{dgas}$ is the area of the planar double gate active shape;
L is the length of the planar double gate active shape;
W is the width of the planar double gate active shape;
$A_{bgdgas}$ is the area of the portion of the bottom gate shape that is associated with the planar double gate active shape;
f is the minimum feature size; and
$A_{acs}$ is the area of the active cavity shape.

Portions of the top gate shapes 642 (FIG. 7) and bottom gate shape 946 (FIG. 10) extend beyond the edges of the active cavity shape 1048 (FIG. 11), as seen from a top view, when the layout layers are aligned with respect to one another. The S/D cavity shape 1049 may be derived from the active cavity shape 1048. For example, the S/D cavity shape can be slightly narrower and shorter than the active cavity shape 1048. Although FIG. 11 includes an illustration with two shapes, each of the shapes can be used in different masks that are used at different times in the fabrication process.

Figure 11:
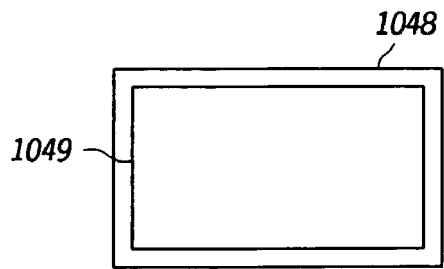
FIG. 11 includes an illustration of an active cavity shape and a source/drain cavity shape generated at least in part from the planar double gate active shape.

A determination can be made whether there is another active cavity or S/D cavity shape to be generated (diamond 846). If "yes," the method is iterated until all active cavity and S/D cavity shapes have been generated. If there are no more active cavity or S/D cavity shapes, the active cavity and S/D cavity shapes can be stored in memory. FIG. 11 includes an illustration of an active cavity shape 1048 and S/D cavity shape 1049 that is generated at least in part from the planar double gate active shape 744 (FIG. 8).

Figure 12:
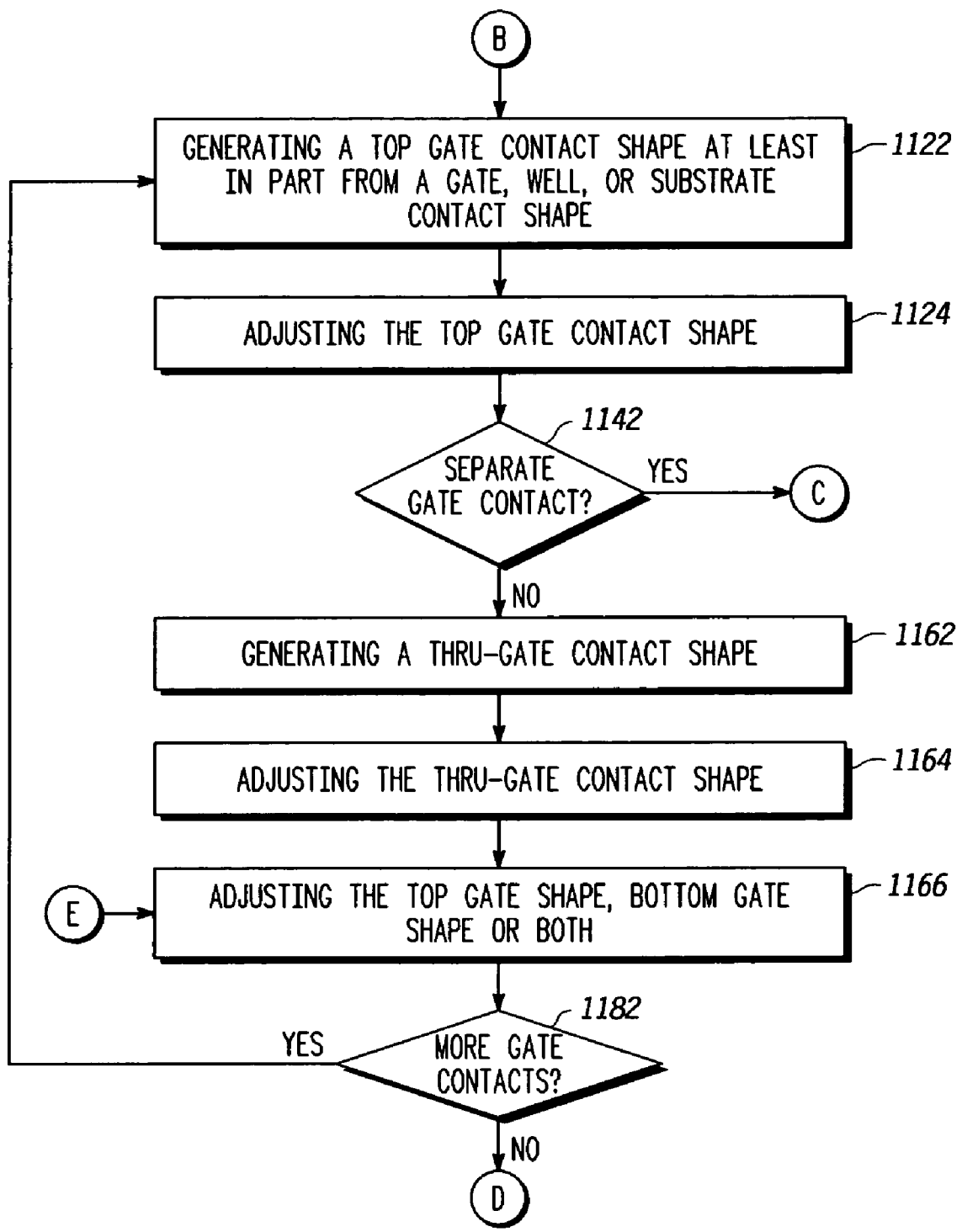
FIGS. 12 and 13 include a flow diagram for generating top gate contact shapes, determining whether top and bottom gates are separate, generating thru-gate contact shapes and bottom gate contact shapes for the planar double gate transistor shapes.

Referring to FIG. 12, the method can include generating a top gate contact shape at least in part from a gate, well, or substrate contact shape of the single transistor layout (block 1122). Each of the top gate contact shapes has a corresponding top gate shape 642 (FIG. 7) that will allow a conductor (e.g., a combination of a contact plug and a metal-containing interconnect) to be electrically connected to the top gate. The top gate contact shape will be located over the one of the top gate shape 642 at a location outside of the active cavity shape 1048 (FIG. 11).

The method can also include and adjusting the top gate contact shape (block 1124) using any one or more of the adjusting operations previously described. The adjustments may be performed in order to better meet one or more of the design specifications, one or more of the design constraints, or any combination thereof.

Other contact shapes (not illustrated) to the top gate shapes can be added at this time. Such other contact shapes can include contact shapes to resistors, capacitor electrodes, other electronic components, or any combination thereof formed within the top gate layout layer.

A determination can be made whether there are separate gate contacts for each planar double gate transistor (diamond 1142). The top and bottom gates for a planar double gate transistor are connected to each other or are connected to different signal lines. For example, the conventional single gate transistor design may have a single gate transistor with its channel region within a well that is biased differently from another single gate transistor with its channel region within the substrate, but outside the well, where the well and substrate are placed at different potentials during operation. In this embodiment, the single gate transistor with its channel within the well region may have separate top and bottom gate contacts for its corresponding planar double gate transistor to allow for the manipulation of the bottom gate because the well contacts from the single gate transistor layer are no longer required, whereas for the other single gate transistor, the top and bottom gates for its corresponding planar double gate transistor may be electrically connected to each other.

In still another embodiment, the determination of whether the top and bottom gates are electrically connected or separate can depend on whether the transistors being formed are to be partially or fully depleted, the work functions of the top or bottom gate, or for having body biasing effect of single gate transistor in low-power mode, or other electronic considerations. After reading this specification, skilled artisans will appreciate that there may be a wide variety of situations where the top and bottom gates should or should not be electrically connected to each other through direct thru-gate contact or separate gate contact for separate bottom gate biasing control.

If "no," the method can include generating a thru-gate contact shape at least in part from a top gate contact shape (block 1162). The thru-gate contact will extend through the top gate and land on the bottom gate. The method can also include adjusting the thru-gate contact shape (block 1164) using any one or more of the adjusting operations previously described.

The adjustments may be performed in order to better meet one or more of the design specifications, one or more of the design constraints, or any combination thereof. The method can further include adjusting the top gate shape, bottom gate shape, or both (block 1166). Such adjustment(s) may be made to ensure that the bottom gate contact shape can fully enclose the bottom gate contact, or it does not contact the top gate shape from a top view, and allow for potential misalignment between the top gate layout layer and the bottom gate contact layout layer.

A determination can be made whether there is another gate contact shape to be examined (diamond 1182). If "yes," the method is iterated until all gate contact shapes have been examined. If there are no more gate contact shapes to be examined, the gate contact shapes can be stored in memory.

Figure 13:
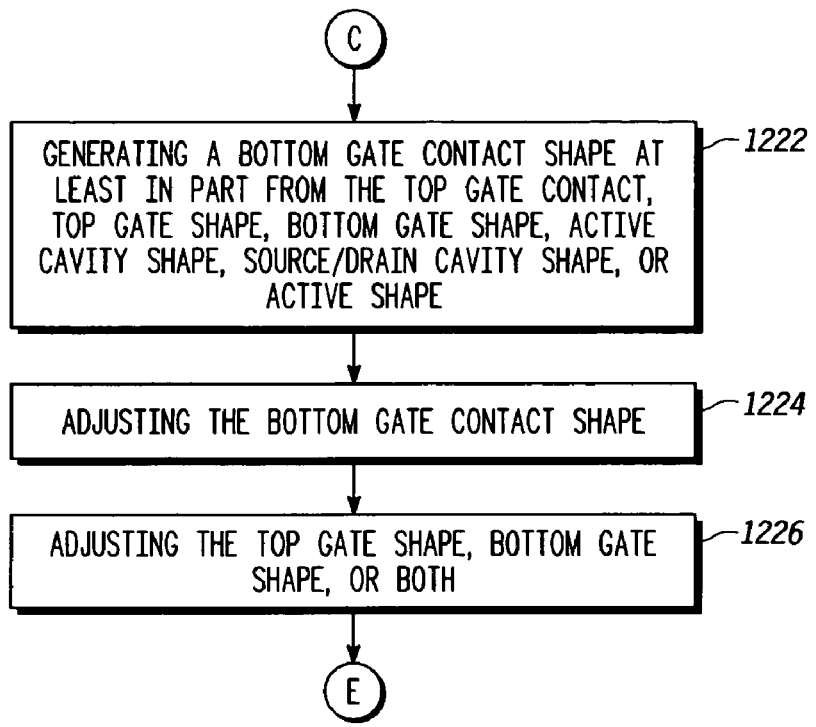

If the top and bottom gates for a planar double gate transistor have separate contacts ("yes" branch from diamond 1142), the method can include generating a bottom gate contact shape at least in part from the top gate contact, top gate shape, bottom gate shape, active cavity shape, S/D cavity shape, or active shape (block 1222 in FIG. 13). In another embodiment, less than all of the shapes as recited in block 1222 may be used in generating the bottom gate contact shapes. The bottom gate contact will land on the bottom gate but will not overlap with the top gate. The method can also include adjusting the bottom gate contact shape (block 1224) using any one or more of the adjusting operations previously described. The adjustments may be performed in order to avoid electrical short between top and bottom gate, better meet one or more of the design specifications, one or more of the design constraints, or any combination thereof. Returning to FIG. 12, the method can also include adjusting the top gate shape, the bottom gate shape, or both (block 1166). The method as described herein is flexible in that the adjustments to shapes can be performed at nearly any time.

Other contact shapes (not illustrated) to the bottom gate shapes can be added at this time. Such other contact shapes can include contact shapes to resistors, capacitor electrodes, other electronic components, or any combination thereof.

Figure 14:
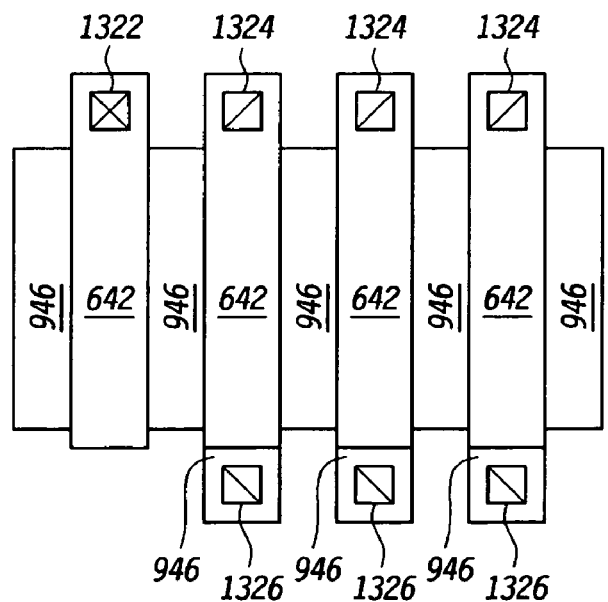
FIG. 14 includes an illustration of gate contact shapes, such as top gate contact, bottom gate contact, and thru-gate contact shapes, in relationship to top and bottom gate shapes.

FIG. 14 includes an illustration of a thru-gate contact shape 1322, top gate contact shapes 1324, and bottom gate contact shapes 1326 to demonstrate positional relationships between the gate contact shapes and their underlying top gate shapes 642 and bottom gate shapes 946, respectively.

In one embodiment, one or more of the lengths or widths of the top gate shapes 642 can be adjusted to expose portions of the underlying bottom gate shape 946 to allow for separate gate contacts for the affected planar double gate transistors. In another embodiment, one or more portions of the bottom gate shapes 946 can be adjusted. The thru-gate contact shape 1322 will allow the top and bottom gates of the left-most planar double gate transistor to be electrically connected to each other. The top gate contact shapes 1324 and bottom gate contact shapes 1326 allow the top gate and bottom gate, within each of the other three planar double gate transistors in FIG. 14, to be at different voltages during operation.

Figure 15:
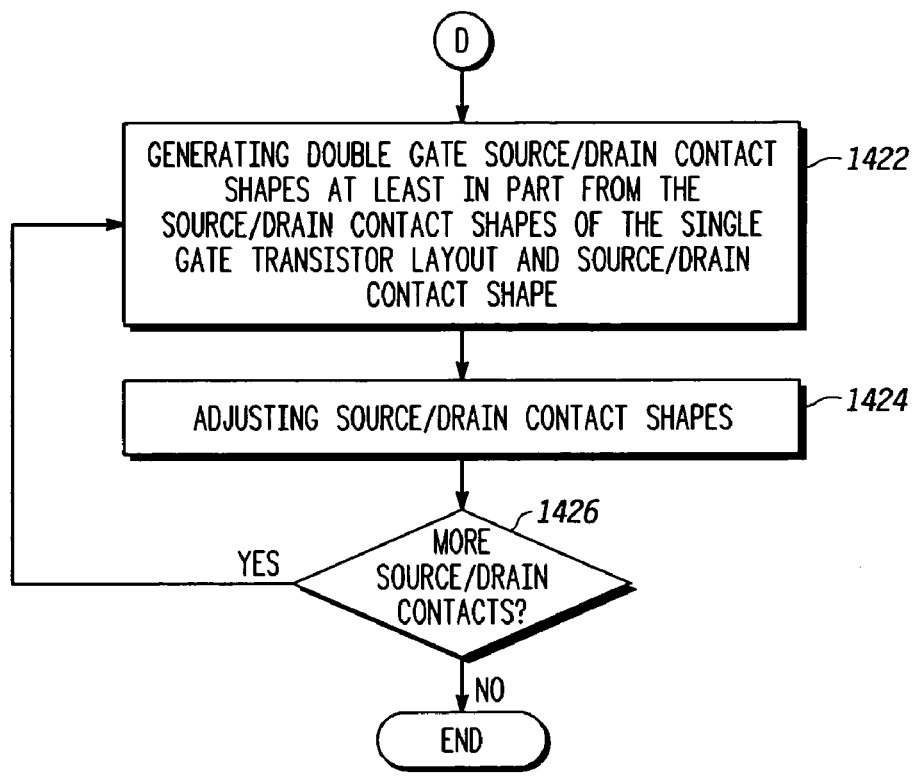
FIG. 15 includes a flow diagram for generating source/drain contact shapes for the planar double gate transistor shapes.
Figure 16:
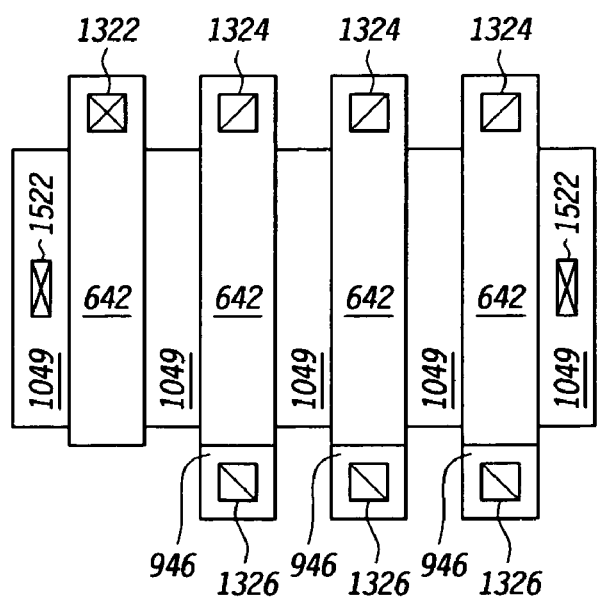
FIG. 16 includes an illustration of source/drain contact shapes in relationship to top and bottom gate shapes and source/drain cavity shapes.

Referring to FIG. 15, the method can include generating S/D contact shapes of the planar double gate transistor layout at least in part from the S/D contact shapes of the single gate transistor layout and the S/D cavity shape 1049 (block 1422). At least some of the S/D contact shapes 1522 in FIG. 16 can be generated at least in part from S/D contact shapes of the single gate transistor. In one embodiment, additional S/D contact shapes 1522 may be generated between serially connected planar double gate transistors, as illustrated in FIG. 16. Although one S/D contact shape 1522 is illustrated adjacent to each side of the planar double gate transistors, more than one S/D contact shape 1522 can be located adjacent to each side of planar double gate transistors.

The method can also include adjusting the S/D contact shapes (block 1424) using any one or more of the adjusting operations previously described. The adjustments may be performed in order to better meet one or more of the design specifications, one or more of the design constraints, or any combination thereof. A determination can be made whether there is another S/D contact shape to be generated (diamond 1426). If "yes," the method is iterated until all S/D contact shapes have been generated. If there are no more S/D contact shapes, the S/D contact shapes can be stored in memory.

Additional layout layers can be automatically generated. The additional layout layers can include one or more contact layout layers, interconnect layout layers, one or more via layout layers, one or more pad layout layers, one or more implant layers, one or more gate layers. The shapes for each of the additional layout layers can be generated from corresponding shapes from the single gate transistor layout. The shapes within the planar double gate transistor layout may need to be moved, adjusted, or otherwise modified to provide the proper specifications or electrical connections for the integrated circuit. After reading this specification, skilled artisans will be able to determine the actions an automated system will perform to generate the proper shapes needed or desired for the integrated circuit.

After reading this specification, skilled artisans will appreciate that the actions described with respect to the method can be performed in a different order than illustrated in the figures. For example, the planar double gate active shape 744 (FIG. 8) may be generated before the top gate shapes 642 (FIG. 7). After reading this specification, skilled artisans will also appreciate that some shapes for the planar double gate transistor shapes may or may not be generated from corresponding shapes in single gate transistor shapes. For example, some of the S/D cavity shapes 1522 (FIG. 16) in the planar double gate transistor shapes may be generated at least in part from S/D contact shapes in the single gate transistor shapes, whereas other S/D cavity shapes 1522 in the planar double gate transistor shapes may be generated without using any of the S/D contact shapes in the single gate transistor shapes.

Figure 17:
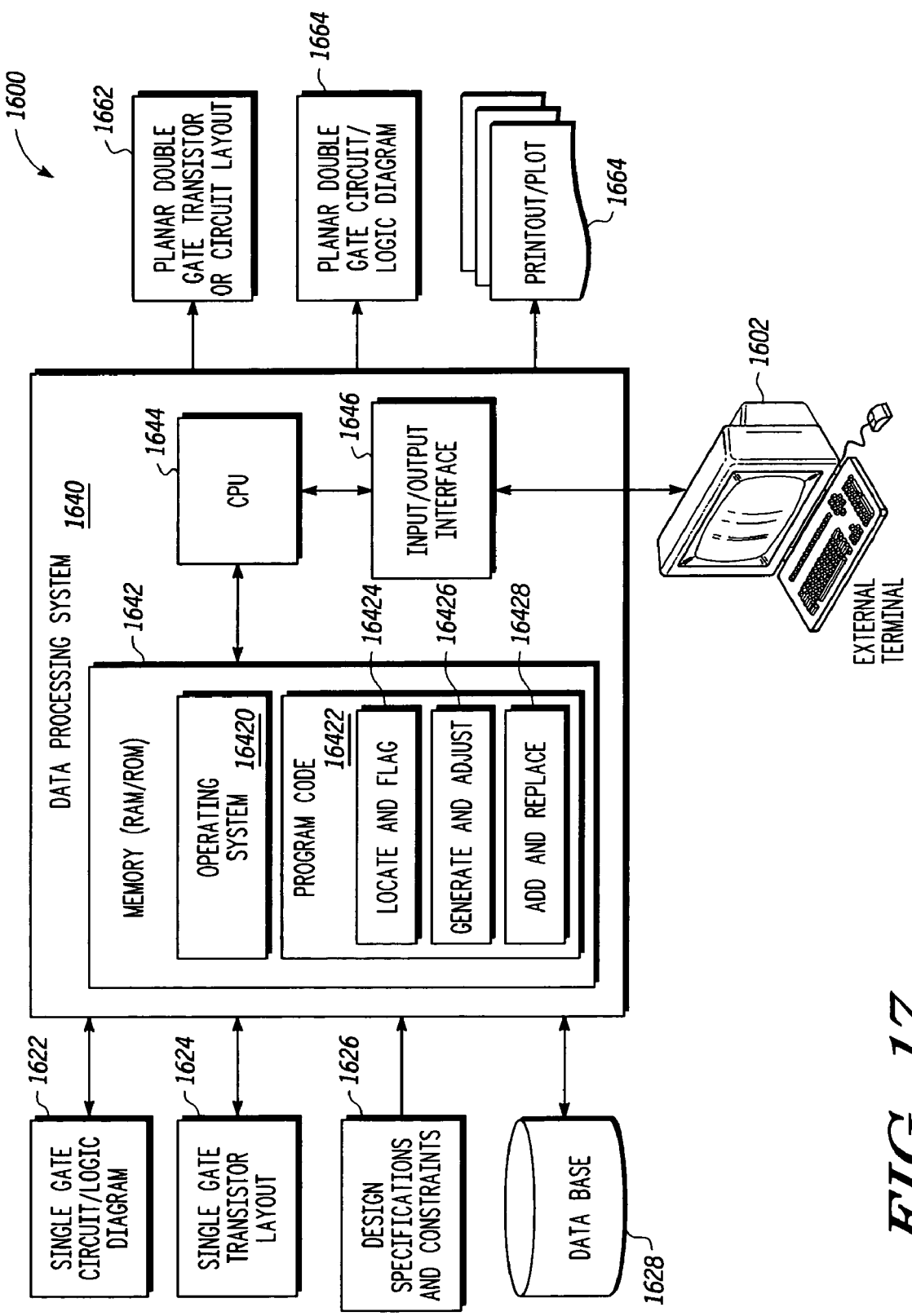
FIG. 17 includes an illustration of a system for automatically generating planar double gate transistor shapes and planar double gate circuit and logic diagram from an input that includes single gate transistor shapes and/or single gate transistor circuit/logic diagram.

FIG. 17 includes an exemplary system 1600 that can be used to automatically generate the planar double gate transistor shapes. The system 1600 includes a data processing system 1640, which in one embodiment can be a standalone computer, a server computer, a distributed computing system, or the like. The data processing system includes at least one central processing unit ("CPU") 1644 that is bi-directionally coupled to memory 1642 and an input/output interface 1646.

The memory 1642 can include random access memory ("RAM"), read only memory ("ROM"), flash memory, tape drive memory, a hard disk, other suitable memory, or any combination thereof. The memory 1642 can include media that can be read by the CPU 1644. Therefore, the memory includes a data processing system readable medium. The memory 1642 can include an operating system 16420 and program code 16422 used to perform operations to generate the planar double gate transistors shapes. The program code 16422 can include a locate and flag module 16424, a generate and adjust module 16426, and an add and replace module 16428. After reading the program code, the CPU 1644 can execute instructions within the program code to carry out the methods described herein. In one embodiment, the instructions may be lines of assembly code, Fortran code, Computer-Assisted Design ("CAD") script code, compiled C++, Java, or other language code.

A terminal 1602 is provided to allow a user to interact with the data processing system 1640. In one embodiment, the terminal 1602 is a monitor with a keyboard and mouse, a workstation, a desktop or laptop computer, or other suitable device to allow a user to provide input to the data processing system 1640 and potentially to receive output from the data processing system 1640.

A user at the terminal 1602 can instruct the data processing system 1640 to read or otherwise access one or more files or other data within a single gate circuit/logic diagram 1622, a conventional single gate transistor layout 1624, design specifications and constraints 1626, a database 1628, other suitable input, or any combination thereof. The data processing system 1640 can perform the methods described herein to automatically generate a planar double gate transistor circuit layout 1662, a planar double gate circuit/logic diagram 1664, a printout/plot 1666, other suitable output, or any combination thereof.

Note that many other embodiments can be used to perform the methods described herein. Therefore, the system 1600 is an exemplary, non-limiting embodiment. After reading this specification, skilled artisans will be able to configure other systems that can perform the methods described herein, where such other systems can be tailored to the needs or desires of an entity operating any of such other systems.

Figure 18:
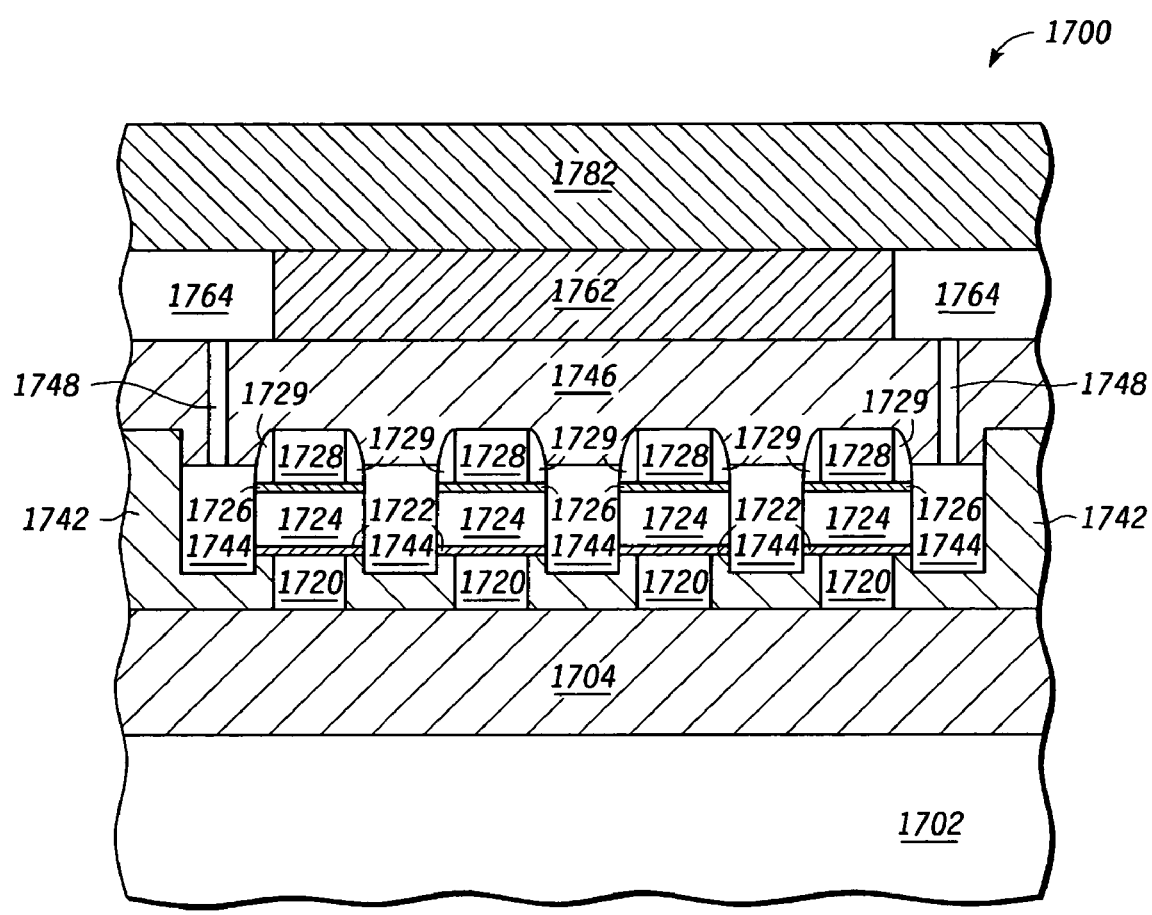
FIG. 18 includes an illustration of a cross-section view of a portion of an electronic device that includes four serially-connected, planar double gate transistors that can be generated using masks having the shapes as described herein.

The information generated by the data processing system 1640 can be used to generate a mask set that can be used to form an integrated circuit 1700, as illustrated by the structure as seen from a cross-sectional view in FIG. 18. The integrated circuit 1700 illustrates the relationships of some of the features using the shapes that were automatically generated using the data processing system 1640. In one embodiment, the integrated circuit 1700 includes a base material 1702 (e.g., a silicon wafer or other suitable material), and an insulating layer 1704. Bottom gate electrodes 1720, bottom gate dielectric layer 1722, active regions 1724, top gate dielectric layer 1726, the top gate electrodes 1728, and sidewall spacers 1729 that overlie portions of the active regions 1724, as illustrated in FIG. 17. Another insulating layer 1742 lies adjacent to the bottom gate electrodes and outside the circuit within the electronic device 1700.

S/D regions 1744 lie between the active regions 1724. Another insulating layer 1746 overlies the top gate electrodes 1728, the S/D regions 1744, and the insulating layer 1742. Contact plugs 1748 extend through the insulating layer 1746 to at least some of the S/D regions 1744. Although not illustrated in FIG. 17, contact plugs contact the top gate electrodes 1728, the bottom gate electrodes 1720, or combinations of top and bottom gate electrodes 1728 and 1720. Still another insulating layer 1762 and interconnects 1764 overlie the insulating layer 1746 and contact plugs 1748, respectively. Other interconnects (not illustrated) are connected to contact plugs (not illustrated) for the top gate electrodes 1728 and bottom gate electrodes 1720.

Additional insulating and interconnection layers can be used. A passivation layer 1782 overlies the uppermost interconnects including pads. Openings (not illustrated) through the passivation layer 1782 can expose pads used to make external power, data, or other signal connections external to the integrated circuit 1700.

The methods described above can be used to automatically generate planar double gate transistors shapes from an existing single gate transistor shape. The use of planar double gate transistors will increase as device performance and semiconductor-on-insulating devices become more prevalent. The methods can more quickly, efficiently, and accurately replace thousands or millions of single gate transistor shapes with planar double gate transistor shapes, as compared to a manual conversion. Therefore, converting an existing single gate transistor layout to a planar double gate transistor layout is commercially feasible.

Many different aspects and embodiments are possible. Some of such aspects and embodiments are described below. After reading this specification, skilled artisans will appreciate that such aspects and embodiments do not limit the scope of the invention.

In a first aspect, a method of generating a planar double gate transistor shape can include locating a single gate transistor shape and automatically generating the planar double gate transistor shape that includes a first gate shape, a planar double gate active shape, and a second gate shape.

In one embodiment of the first aspect, locating the single gate transistor shape includes locating a set of layout layers associated with the single gate transistor shape. In a particular embodiment, locating a set of layout layers includes locating a layer from the set of layers, wherein the set of layers includes any combination of a gate layout layer, an active layout layer, an implantation layout layer, a contact layout layer, a via layout layer, a metal layout layer, an interconnection layout layer, a well layout layer, and a passivation layout layer. In another embodiment, locating the single gate transistor shape further includes locating a gate shape associated with a single gate transistor, and locating an active shape associated with the single gate transistor. In another particular embodiment, locating the gate shape of the single gate transistor shape includes determining the gate shape from a gate layout layer, an active layout layer, or any combination thereof and determining an active shape from a gate layout layer, an active layout layer, or any combination thereof.

In still another embodiment of the first aspect, automatically generating the planar double gate transistor shape includes automatically generating the first gate shape at least in part from the gate shape of the single gate transistor. In a particular embodiment, automatically generating the first gate shape further includes adjusting the first gate shape based at least in part on a design specification, a design constraint, the planar double gate active shape, or any combination thereof. In yet another embodiment, automatically generating the planar double gate transistor shape includes automatically generating the planar double gate active shape at least in part from the active shape of the single gate transistor. In yet another particular embodiment, automatically generating the planar double gate active shape further includes adjusting the planar double gate active shape based at least in part on a design specification, a design constraint, or any combination thereof.

In a further embodiment of the first aspect, automatically generating the planar double gate transistor shape further includes automatically generating the second gate shape at least in part from the first gate shape. In a particular embodiment, automatically generating the second gate shape further includes adjusting the second gate shape based at least in part on a design specification, a design constraint, the planar double gate active shape, or any combination thereof. In a more particular embodiment, automatically generating the planar double gate transistor shape further includes generating a resistor shape, a capacitor electrode, an analog circuit component shape, or any combination thereof at a same layout layer as the first gate shape, the second gate shape, or the planar double gate active shape and adjusting the resistor shape, the capacitor electrode, the analog circuit component shape, or any combination thereof based at least in part on a design specification, a design constraint, or any combination thereof.

In still a further embodiment of the first aspect, automatically generating the planar double gate transistor shape further includes generating an active cavity shape and adjusting the active cavity shape based at least in part on a design specification, a design constraint, or any combination thereof. In still a further embodiment, automatically generating the planar double gate transistor shape further includes generating planar double gate S/D contact shapes and adjusting the planar double gate S/D contact shapes based at least in part on a design specification, a design constraint, or any combination thereof. In yet a further embodiment, automatically generating the planar double gate transistor shape further includes generating a first gate contact shape to the first gate shape, a second gate contact shape to the second gate shape, or both at least in part from a gate contact of the single gate transistor shape and adjusting the first gate contact shape, the second gate contact shape, or both based at least in part on a design specification, a design constraint, or any combination thereof. In another embodiment, automatically generating the planar double gate transistor shape further includes generating second gate contact shape at least in part from the well contact, a substrate contact, or both of the single gate transistor shape and adjusting the second gate contact based at least in part on a design specification, a design constraint, or any combination thereof. The first gate shape is not electrically connected to the second gate shape. In another embodiment, the method can further include fabricating the electronic device at least in part using the first planar double gate transistor shape.

In a second aspect, a method of automatically generating a planar double gate transistor shape can include locating a gate shape associated with a single gate transistor and locating an active shape associated with the single gate transistor. The method can also include generating the first gate shape at least in part from the gate shape of the single gate transistor, generating a planar double gate active shape at least in part from the active shape of the single gate transistor, generating the second gate shape at least in part from the first gate shape and the planar double gate active shape, and generating an active cavity shape at least in part from the planar double gate active shape. The method can further include adjusting the first gate shape, the planar double gate active shape; the second gate shape, the active cavity shape, or any combination thereof based at least in part on a design specification, a design constraint, or any combination thereof.

In a third aspect, a data processing system readable medium can have code to generate a planar double gate transistor shape, wherein the code is embodied within the data processing system readable medium. The code can include an instruction to locate a single gate transistor shape, and an instruction to generate the planar double gate transistor shape that includes a first gate shape, a planar double gate active shape, and a second gate shape.

In one embodiment of the third aspect, the instruction to locate a single gate transistor shape includes an instruction to find a gate shape associated with a single gate transistor, and an instruction to find an active shape associated with the single gate transistor. In another embodiment, the instruction to generate the planar double gate transistor shape includes an instruction to generate the first gate shape at least in part from the gate shape of a single gate transistor, an instruction to generate a planar double gate active shape at least in part from the active shape of the single gate transistor, an instruction to generate the second gate shape at least in part from the first gate shape and the planar double gate active shape, and an instruction to generate an active cavity shape at least in part from the planar double gate active shape, and an instruction to adjust the first gate shape, the planar double gate active shape; the second gate shape, the active cavity shape, or any combination thereof based at least in part on a design specification, a design constraint, or any combination thereof.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A method of generating a planar double gate transistor shape comprising:
    locating a single gate transistor shape; and
    automatically generating the planar double gate transistor shape that includes a first gate shape, a planar double gate active shape, and a second gate shape, wherein the first gate shape is designed to overlie the planar double gate transistor shape, and the second gate shape is designed to underlie an entire width of a planar double gate active shape.

2. The method of claim 1, wherein locating the single gate transistor shape comprises locating a set of layout layers associated with the single gate transistor shape.

3. The method of claim 2, wherein locating a set of layout layers comprises locating a layer from the set of layers, wherein the set of layers includes any combination of a gate layout layer, an active layout layer, an implantation layout layer, a contact layout layer, a via layout layer, a metal layout layer; an interconnection layout layer, a well layout layer, and a passivation layout layer.

4. The method of claim 1, wherein locating the single gate transistor shape further comprises:
    locating a gate shape associated with a single gate transistor shape; and
    locating an active shape associated with the single gate transistor shape.

5. The method of claim 4, wherein locating the gate shape of the single gate transistor shape comprises:
    determining the gate shape horn a gate layout layer of a single gate integrated circuit layout, an active layout layer of the single gate integrated circuit layout, or any combination thereof; and
    wherein locating the active shape of the single gate transistor shape comprises:
        determining an active shape from a gate layout layer of the single gale integrated circuit layout, an active layout layer of the single gate integrated circuit layout, or any combination thereof.

6. The method of claim 1, wherein automatically generating the planar double gate transistor shape comprises generating the first gate shape at least in part from the gate shape of the single gate transistor shape.

7. The method of claim 6, wherein automatically generating the first gate shape further comprises adjusting the first gate shape based at least in part on a design specification, a design constraint, the planar double gate active shape, or any combination thereof.

8. The method of claim 1, wherein automatically generating the planar double gate transistor shape comprises generating the planar double gate active shape at least in part from the active shape of the single gate transistor shape.

9. The method of claim 8, wherein automatically generating the planar double gate active shape further comprises adjusting the planar double gate active shape based at least in part on a design specification, a design constraint, or any combination thereof.

10. The method of claim 1, wherein automatically generating the planar double gate transistor shape further comprises generating the second gate shape at least in part from the first gate shape.

11. The method of claim 10, wherein automatically generating the second gate shape further comprises adjusting the second gate shape based at least in part on a design specification, a design constraint, the planar double gate active shape, or any combination thereof.

12. The method of claim 11, wherein automatically generating the planar double gate transistor shape further comprises:
generating a resistor shape, a capacitor electrode, an analog circuit component shape, or any combination thereof at a same layout layer as the first gate shape, the second gate shape, or the planar double gate active shape; and
adjusting the resistor shape, the capacitor electrode, the analog circuit component shape, or any combination thereof based at least in pail on a design specification, a design constraint, or any combination thereof.

13. The method of claim 1, wherein automatically generating the planar double gate transistor shape fluffier comprises:
generating an active cavity shape; and
adjusting the active cavity shape based at least in part on a design specification, a design constraint, the planar double gate active shape, the source/drain cavity shape, or any combination thereof.

14. The method of claim 1, wherein automatically generating the planar double gate transistor shape further comprises:
generating source/drain cavity shapes; and
adjusting the planar double gate source/drain cavity shapes based at least in part on a design specification, a design constraint, the planar double gate active shape, the active cavity shape, or any combination thereof.

15. The method of claim 1, wherein automatically generating the planar double gate transistor shape further comprises:
generating a first gate contact shape to the first gate shape, a second gate contact shape to the second gate shape, or both at least in part from a gate contact, a well contact or a substrate contact of the single gate transistor shape; and
adjusting the first gate contact shape, the second gate contact shape, or both based at least in part on a design specification, a design constraint, the planar double gate active shape or any combination thereof.

16. The method of claim 1, wherein automatically generating the planar double gate transistor shape further comprises:
generating a second gate contact shape to the second gate shape at least in part from the well contact, a substrate contact, or both of the single gate transistor shape; and
adjusting the second gate contact based at least in part on a design specification, a design constraint, the planar double gate active shape or any combination thereof,
wherein the first gate shape is not electrically connected to the second gate shape.

17. The method of claim 1, further comprising fabricating the electronic device at least in part using the first planar double gate transistor shape.

18. The method of claim 1, wherein:
locating the single gate transistor shape comprises:
determining the gate shape from a gate layout layer of a single gate integrated circuit layout, an active layout layer of the single gate integrated circuit layout, or any combination thereof; and
determining an active shape from a gate layout layer of the single gate integrated circuit layout, an active layout layer of the single gate integrated circuit layout, or any combination thereof; and
automatically generating the planar double gate transistor shape comprises:
generating an active cavity shape;
adjusting the active cavity shape based at least in part on a design specification, a design constraint, the planar double gate active shape, the source/drain cavity shape, or any combination thereof;
generating source/drain cavity shapes; and
adjusting the planar double gate source/drain cavity shapes based at least in part on a design specification, a design constraint, the planar double gate active shape, the active cavity shape, or any combination thereof.

19. The method of claim 1, wherein automatically generating the planar double gate transistor shape comprises:
generating the first gate shape at least in part from the gate shape of the single gate transistor shape;
adjusting the first gate shape based at least in part on a design specification, a design constraint, the planar double gate active shape, or any combination thereof;
generating the planar double gate active shape at least in part from the active shape of the single gate transistor shape;
adjusting the planar double gate active shape based at least in part on a design specification, a design constraint, or any combination thereof;
generating the second gate shape at least in part from the first gate shape; and
adjusting the second gate shape based at least in part on a design specification, a design constraint, the planar double gate active shape, or any combination thereof.

20. The method of claim 19, wherein automatically generating the planar double gate transistor shape further comprises:
generating a resistor shape, a capacitor electrode, an analog circuit component shape, or any combination thereof at a same layout layer as the first gate shape, the second gate shape, or the planar double gate active shape; and
adjusting the resistor shape, the capacitor electrode, the analog circuit component shape, or any combination thereof based at least in part on a design specification, a design constraint, or any combination thereof.

21. A method of automatically generating a planar double gate transistor shape comprising:
locating a gate shape associated with a single gate transistor;
locating an active shape associated with the single gate transistor;

generating the first gate shape at least in part from the gate shape of the single gate transistor;
generating a planar double gate active shape at least in part from the active shape of the single gate transistor;
generating the second gate shape at least in part from the first gate shape and the planar double gate active shape;
generating an active cavity shape at least in part from the planar double gate active shape; and
adjusting the first gate shape, the planar double gate active shape; the second gate shape, the active cavity shape, or any combination thereof based at least in part on a design specification, a design constraint, or any combination thereof.

* * * * *

UNITED STATES PATENT AND TRADEMARK OFFICE
CERTIFICATE OF CORRECTION

PATENT NO.         : 7,491,594 B2                                        Page 1 of 1
APPLICATION NO.    : 11/258987
DATED              : February 17, 2009
INVENTOR(S)        : Dao It is certified that error appears in the above-identified patent and that said Letters Patent is hereby corrected as shown below:

Column 14, Line 52, please change "horn" to --from--

Column 15, Line 31, please change "pail" to --part--

Column 15, Line 34, please change "fluffier" to --further--

Signed and Sealed this

Twenty-seventh Day of April, 2010

David J. Kappos
*Director of the United States Patent and Trademark Office*